(12) United States Patent
Jung et al.

(10) Patent No.: US 7,068,949 B2
(45) Date of Patent: Jun. 27, 2006

(54) MULTI-WAVELENGTH LOCKING METHOD AND APPARATUS FOR WAVELENGTH DIVISION MULTIPLEXING (WDM) OPTICAL COMMUNICATION SYSTEM

(75) Inventors: Yeun Chol Jung, Taejon (KR); Keun Joo Park, Junranam-do (KR); Seung Gyun Shin, Seoul (KR); Ho Chul Ji, Seoul (KR)

(73) Assignee: Korea Advanced Institute of Science & Technology, Taejon (KR)

( * ) Notice: Subject to any disclaimer, the term of this patent is extended or adjusted under 35 U.S.C. 154(b) by 329 days.

(21) Appl. No.: 09/799,537

(22) Filed: Mar. 7, 2001

(65) Prior Publication Data

US 2002/0048063 A1    Apr. 25, 2002

(30) Foreign Application Priority Data

Sep. 7, 2000    (KR) .............................. 2000-53216

(51) Int. Cl.
H04J 14/02 (2006.01)
H04B 10/04 (2006.01)
H01S 3/13 (2006.01)

(52) U.S. Cl. .......................... 398/195; 398/79; 398/85; 398/196; 398/200; 372/29.011; 372/29.015

(58) Field of Classification Search .............. 398/192, 398/195, 196, 197, 198, 200, 79, 85, 93, 398/94, 95, 32, 187; 372/26, 29.011, 29.015, 372/29.014, 29.021
See application file for complete search history.

(56) References Cited

U.S. PATENT DOCUMENTS 5,060,310 A * 10/1991 Frisch et al. ................ 398/193
5,706,112 A * 1/1998 Morita et al. ................ 398/162
6,388,782 B1 * 5/2002 Stephens et al. ............... 398/79
6,396,603 B1 * 5/2002 Kim ............................. 398/91

* cited by examiner (Continued)

FOREIGN PATENT DOCUMENTS

EP    1 050 982 A1 *    4/2000

OTHER PUBLICATIONS

Woo et al., "A Multi-wavelength Locker for WDM System", Optical Fiber Communication Conference, Technical Digest, Mar. 8, 2000.*

Primary Examiner—M. R. Sedighian
(74) Attorney, Agent, or Firm—Bacon & Thomas, PLLC

(57) ABSTRACT

Disclosed is a multi-wavelength locking method for a wavelength division multiplexing (WDM) optical communication network, and in particular, a multi-wavelength locking method and apparatus for a WDM optical communication system that can lock wavelengths of optical signals by producing pilot tones by applying a sine-wave current to a plurality of transmission lasers having different wavelengths, passing the optical signal through a Fabry-Perot etalon filter, and then Fourier-transforming the filtered optical signal. The multi-wavelength locking method includes frequency-modulating an optical signal by applying a small and specified sine-wave current to a bias current for driving WDM lasers, detecting pilot tones produced after filtering the optical signal through a filtering section and converting the detected signal into a digital signal by performing a sampling of the detected signal, detecting a magnitude and phase of the pilot tones by performing a fast Fourier transform, providing Fourier-transformed data as a first derivative signal of the filtering section, and locking an operation wavelength of WDM channels by controlling the temperature or current if resonance frequencies of the filtering section coincide with respective standard frequency.

16 Claims, 3 Drawing Sheets

MULTI-WAVELENGTH LOCKING METHOD AND APPARATUS FOR WAVELENGTH DIVISION MULTIPLEXING (WDM) OPTICAL COMMUNICATION SYSTEM

BACKGROUND OF THE INVENTION

1. Field of the Invention

The present invention relates to a multi-wavelength locking method for a wavelength division multiplexing (WDM) optical communication network. In particular, the present invention relates so a multi-wavelength locking method and apparatus for a WDM optical communication system that can lock wavelengths of optical signals by producing pilot tones by applying a sine-wave current to a plurality of transmission lasers having different wavelengths, passing the optical signal through a Fabry-Perot etalon filter, and then Fourier-transforming the filtered optical signal.

2. Description of the Related Art

A wavelength division multiplexing (WDM) optical communication system is an effective super-high-speed and super-wide-band transmission system that multiplexes optical signals of various wavelengths and transmits the optical signals through one optical fiber.

Currently, due to the rush of various kinds of data traffics including Internet, the WDM optical communication system has a reduced channel spacing, and accommodates lots of channels.

Thus, it becomes important to accurately control frequencies of respective lasers in the system. For example, if the channel spacing is 50 GHz, the frequencies of the respective lasers operating at a transmission speed of 10 Gb/s should be locked within 2.5 GHz.

However, frequencies of semiconductor distributed feedback (DFB) lasers widely used may vary in the range of tens of GHz due to their aging even though the current, temperature, etc., for driving the lasers are kept constant, and thus the frequencies of he respective lasers should be locked to reference frequencies.

Recently, there have been proposed methods of improving the frequency Locking state of the WDM lasers using a fiber grating, arrayed waveguide grating (AWG), etalon filter etc., as a frequency reference element.

However, to lock the respective WDM lasers to the optical frequencies recommended by International Telecommunication Union (ITU), fiber gratings whose number is as many as the number of channels being used are required, and the reflection and transmission characteristics of the respective fiber gratings should coincide with the standard frequencies.

According to the wavelength locking method using the AWG, the WDM lasers can be simultaneously locked, but the maximum number of channels that can be locked is limited by the free spectral range (FSR) of the commercialized AWG. Also, since the respective band-pass characteristics of the AWG are slightly different from one another, the wavelength locking state of the respective WDM channel may deteriorate.

Meanwhile, the etalon filter synchronized with the reference frequency can provide absolute frequencies consistent with the standard frequencies without using the frequency-locked lasers.

By adjusting the incident angle, the etalon filter that coincides with the reference frequency and thus provides certain frequencies with the equal spacing can be easily provided.

An automatic wavelength locking system using the synchronized etalon filter is disclosed in Korean Patent Application No 97-17558 "Cold-start type wavelength division multiplexing optical transmission system and standard frequency generating method thereof". However, in the same manner as the most locking methods, it has problems in that it requires lock-in amplifiers as much as the number of WDM channels.

As the number of WDM channels, the system becomes complicated and non-economical.

If the lock-in amplifiers are used for locking the wavelengths, frequency offsets may exist due to the transmission function of the etalon filter.

This transmission function of the etalon filter is caused by an intensity modulation of the laser due to the pilot tone. In order to suppress the intensity modulation effect of the laser due to the pilot tone, the phase of the standard signal inputted to the lock-in amplifier should be accurately controlled to be 0.5 $\pi$.

SUMMARY OF THE INVENTION

Therefore, an object of the present invention is to solve the problems involved in the related art, and to provide a multi-wavelength locking method for a wavelength division multiplexing (WDM) optical communication system that can lock lots of WDM channels through one control loop simultaneously and lock frequencies of respective lasers simultaneously by effectively suppressing a frequency offset due to the intensity modulation produced from the lasers using a fast Fourier transform.

It is another object of the present invention to provide a multi-wavelength locking apparatus for a WDM optical communication system that can easily implement a frequency locking apparatus with a digital signal processing board, which is composed of two optical receivers, analog-to-digital (A/D) converter, digital-to-analog (D/A) converter, microprocessor, etc., and a Fabry-Perot etalon filter, and thus can make a great contribution to the multi-wavelength locking of a multi-channel WDM optical communication system.

In order to achieve the above objects, there is provided a simple method of locking a plurality of WDM lasers simultaneously using one feed back loop.

In accordance with the present invention, an etalon filter and a digital signal processing board are used.

In order to frequency-modulating an optical signal, small and specified sine-wave current i.e., pilot tones) is applied to the bias current for driving respective WDM lasers.

This current is used as the pilot tone for the channel recognition and optical signal monitoring in the WDM optical communication system.

The present invention provides a method and apparatus for locking wavelengths of respective lasers using a fixed Fabry-Perot etalon filter, optical receivers, A/D converter, microprocessor, D/A converter, etc.

According to the locking method according to the present invention, the pilot tones are detected using the optical receivers and the A/D converter after the optical signal passes through the Fabry-Perot etalon filter, and the magnitude and phase of the respective pilot tone are detected by performing the fast Fourier transform with respect to the pilot tones using the microprocessor. The Fourier-transformed data is provided as a first differentiation signal of the Fabry-Perot etalon filter, and if the resonance frequencies of the Fabry-Perot etalon filter coincide with the respective standard frequencies, the temperature or current of the respective laser is adjusted using the D/A converter, thereby easily locking the operation wavelength of the respective WDM channel.

The above-described locking method according to the present invention will now be explained in detail with reference to related equations.

First, if the output optical power of the laser that is used as a transmitter of the WDM optical communication system is somewhat modulated by applying to the laser small sine-wave current having different frequencies with the bias current, the output optical power of the laser and the optical frequency of the laser are expressed by the following equation.

$$P(t) = \sum_n (P_n + \Delta P_n \sin(w_n t)) \quad \text{[Equation 1]}$$

$$v_n(t) = v_n - \Delta v_n \sin(\omega_n t + 100\,_n) \quad \text{[Equation 2]}$$

In Equations 1 and 2, $P_n$ denotes a mean optical power (i.e., output) of the n-th laser, $\Delta P_n$ the peak value of the sine-wave portion of the laser optical output, $v_n$ the center frequency of the laser, $\Delta v_n$ the peak deviation of the laser frequency applied due to the sine-wave current, and $\phi_n$ the phase delay between he intensity (i.e., optical power) modulation and the frequency modulation or the lakes, respectively.

At this time, the ratio of $\Delta P_n$ to $P_n$ is defined as a modulation index $M_n$ and expressed by $$M_n = \frac{\Delta P_n}{P_n} \quad \text{[Equation 3]}$$

The modulation index can be known by measuring $P_n$ and $\Delta P_n$ in the transmitter, and it is preferable that it is within the range of 10% so that it does not affect the performance of the transmission system.

In order to locking the frequencies of the respective channels, the Fabry-Perot etalon filter is used along with the pilot tones.

If it is assumed that $\Delta v_n$ is quite smaller than the pass band of the Fabry-Perot etalon filter, the pilot tones which have passed through the Fabry-Perot etalon filter are detected by the receiver, and is expressed by the following equation $$S(t) = \quad \text{[Equation 4]}$$
$$\sum_n [(T(v_n) - T'(v_n)\Delta v_n \sin(\omega_n t + \phi_n))(P_n + \Delta P_n(\sin(\omega_n t)))]$$

Here, $T(v_n)$ denotes the transmission function of the Fabry-Perot etalon filter, and $T'(v_n)$ denotes the first derivative of $T(v_n)$.

By performing the fast Fourier transform with respect to Equation 4, the respective frequencies of he pilot tones are shown by $$S(\omega) = \sum_n \frac{\Delta P_r}{4\pi} \left[ \left[ -\frac{\Delta v_r}{M_n} \sin(\phi_n) T'(v_n) + \right. \right. \quad \text{[Equation 5]}$$

-continued
$$\left. \left. j\left(\frac{\Delta v_n}{M_n}\cos(t_n)T'(v_n) - T(v_n)\right)\right] \delta(\omega - \omega_n) \right]$$

Equation 5 shows that if the tone signal is detected by passing the WDM signal through the Fabry-Perot etalon filter, and then the fast Fourier transform is performed, a real part and an imaginary part appear in the frequency of the respective pilot tone.

It can be recognized that according to Equation 5, only the first derivative (i.e., differentiation function) of the Fabry-Perot etalon filter exists in the real part, and thus the optical frequency $v_n$ of the respective channel can be locked into the respective resonance frequency of the Fabry-Perot etalon filter using the real part of the converted data.

If the wavelength is locked using the conventional lock-in amplifiers instead of the above-described digital signal processing method, the frequency offset exists due to the transmission function of the Fabry-Perot etalon filter located in the imaginary part in FIG. 5.

The transmission function of the Fabry-Perot etalon filter is caused by the intensity modulation of the laser due to the pilot tone, and thus in order to suppress the intensity modulation effect of the laser due to the pilot tone, the phase of the reference signal inputted to the lock-in amplifier should be accurately controlled to be 0.5 π. On the contrary, according to the digital signal processing method of the present invention, the frequency offset can be effectively suppressed using only the real part of the Fourier-transformed data, and thereby all the channels call be locked simultaneously.

In accordance with the present invention, there is provided a multi-wavelength locking apparatus for a wavelength division multiplexing (WDM) optical communication system comprising:

modulation means for modulating output wavelengths of a plurality of transmission lasers having different wavelengths;

optical distribution means for dividing an optical signal into two marts to lock wavelengths of the wavelength-division-multiplexed optical signal simultaneously;

optical detection means for detecting one of the two divided parts of the optical signal;

optical filtering means for filtering the wavelength-division-multiplexed optical signal in an optical frequency range;

optical detection means for detecting the other of the two divided parts of the optical signal after passing through the optical filtering means to lock the wavelengths of the wavelength-division-multiplexed optical signal into respective reference frequencies;

operation means for detecting a first derivative of the optical filtering means by performing an operation with respect to the detected optical signal; and output means for producing a specified output for controlling the transmission lasers in accordance with the detected first derivative.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF THE PREFERRED EMBODIMENT

Hereinafter, the present invention will be described with respect to the preferred embodiment illustrated in the annexed drawings.

Figure 1:
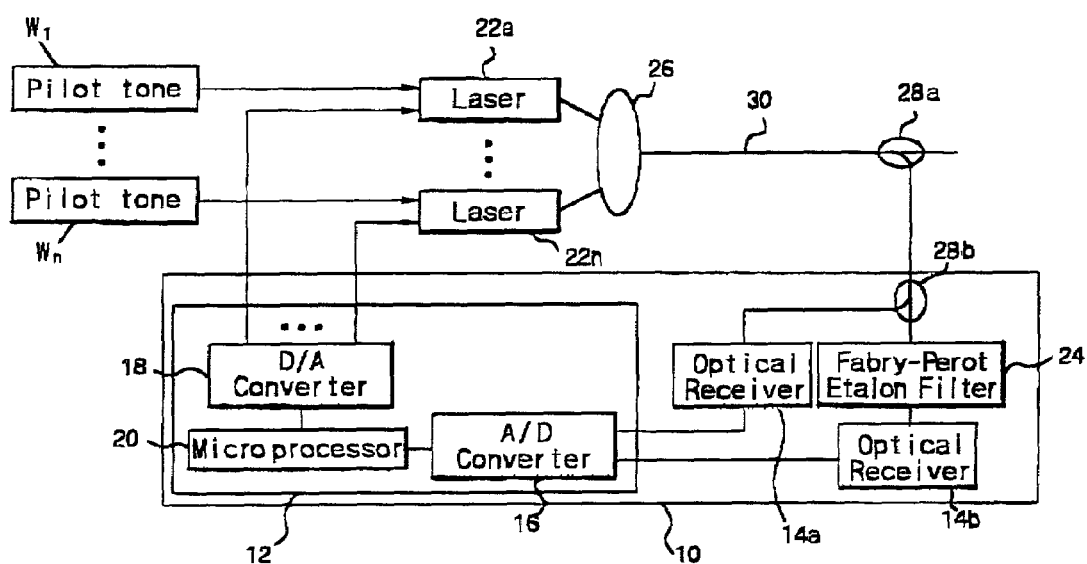
FIG. 1 is a block diagram illustrating the construction of a multi-wavelength locking apparatus according to the present invention.

FIG. 1 is a block diagram illustrating the construction of a multi-wavelength locking apparatus according to the present invention. Referring to FIG. 1, the multi-wavelength locking apparatus according to the present invention includes 2×2 optical coupler 26 as the optical distribution means, optical receivers 14a and 14b as the optical detection means, a Fabry-Perot etalon filter 24 as the optical filtering means, an analog-to-digital (A/D) converter 16 and a microprocessor 20 as the operation means, and a digital-to-analog (D/A) converter 18 as the output means.

As the optical filtering means, one among an optical fiber Fabry-Perot filter whose spacing between resonance frequencies is similar to the channel spacing of the wavelength-division-multiplexed signal, an arrayed waveguide grating (AWG) whose spacing between resonance frequencies is similar to the channel spacing of the wavelength-division-multiplexed signal, and an optical filter for filtering in the vicinity of an optical frequency region where the respective wavelength-division-multiplexed optical signals operate may be used instead of the Fabry-Perot etalon filter 24.

In FIG. 1, used lasers 22a, 22b . . . 22n are wavelength selection type optical Feedback lasers which operate in the wavelength band of 1550 nm.

When a sine-wave current whose frequency range is 101 KHz to 116 KHz and whose frequency spacing is 1 KHz is separately applied to the lasers, pilot tones $\omega_1, \omega_2 \ldots \omega_n$ are produced.

The pilot tones $\omega_1, \omega_2 \ldots \omega_n$ on can be simultaneously applied to a frequency stabilization, channel recognition, monitoring of optical signals, etc., in the WDM optical communication system, and the mean output of the respective lasers 22a, 22b . . . 22n is 3 dBm.

When the optical feedback lasers are modulated by the small input current as described above, their output optical frequencies are also modulated.

If the frequency of the input modulation current is small, he temperature modulation in an active region of the lasers 22a, 22b . . . 22n occurs easily, and this causes the optical frequency modulation to occur greatly.

It can be recognized from Equation 5 that if the peak value of the modulated frequency is large, the real part of the Fourier-transformed data appears greatly. Thus, in order to improve the wavelength stability, the modulation frequency is selected within the range of 10 KHz.

Meanwhile, in case that the pilot tones $\omega_1, \omega_2 \ldots \omega_n$ are used for monitoring of the performance of the WDM optical communication network, the monitoring performance may deteriorate due to the slow dynamic characteristic of an erbium-doped fiber amplifier (EDFA). However, if the pilot tones $\omega_1, \omega_2 \ldots \omega_n$ having a high frequency are used, this can be suppressed.

According to the present invention, in order to suppress the effect caused by the slow dynamic characteristic, a modulation frequency in the band of 100 KHz is used.

The amount of modulation of the optical frequency produced in the band of 100 KHz is three times smaller than that produced in the band of 10 KHz, and the peak value of the measured frequency modulation is 0.16–4 GHz.

Also, in order to improve the wavelength stability, the peak value of the modulation current should be increased as shown in Equation 5, but the pilot tones $\omega_1, \omega_2 \ldots \omega_n$ interfere with the data signal to cause a penalty in the transmission system. Since the penalty does not relate to the modulation frequency of the pilot tones $\omega_1, \omega_2 \ldots \omega_n$ but relates only to its magnitude, it can be prevented by reducing the peak value of the modulation current of the pilot tones $\omega_1, \omega_2 \ldots \omega_n$.

For instance, according to the present invention, in order to restrict within 0.5 dB the penalty caused by the pilot tones $\omega_1, \omega_2 \ldots \omega_n$ of the data signal having the transmission speed of 10 Gb/s (i.e., the pattern length of $2^{31}-1$), the peak value of the modulation current of the pilot zones $\omega_1, \omega_2 \ldots \omega_n$ is determined to be 3 mA.

At this time, the modulation index is about 10%, and the phase difference between the intensity modulation and the frequency modulation is $-0.2 \pi$ when the modulation frequency is in the band of 100 KHz.

The outputs of the optical feedback lasers whose channel spacing is selected to be 100 GHz are inputted to one optical fiber 30 through the optical coupler 26 for extracting the signal at a constant ratio, and a portion of this signal is inputted to the locking apparatus 10 through a tap coupler 28a to lock the frequencies.

The inputted optical signal is divided into two parts through a tap coupler 28b. One part is inputted to the receiver 14a to be converted into an electric signal, and the other part is inputted to the Fabry-Perot etalon filter 24.

The Fabry-Perot etalon filter 24 is manufactured by coating dielectric films on both sizes of a quartz glass.

The Fabry-Perot etalon filter 24 provides equally spaced frequencies which coincide with the standard frequencies recommended by the ITU, and the variation amount of the respective resonance frequency against temperature is $-1$ GHz/° C.

Also, the respective resonance frequencies of the Fabry-Perot etalon filter 24 are controlled to be within ±50 MHz by a temperature controller.

If the temperature of the Fabry-Perot etalon filter 24 is controlled in the above described manner, the temperature dependence of the Fabry-Perot etalon filter 24 can be effectively suppressed even though the ambient temperature is increased up to 60° C.

The output of the Fabry-Perot etalon filter 24 is inputted to another optical receiver 14b to be converted into an electric signal.

The electric signals converted through the optical receivers 14a and 14b are inputted to a digital signal processing board 12 or measuring the magnitude and phase of the input electric signals using the fast Fourier transform.

The digital signal processing board 12 comprises the A/D converter 16 for performing a sampling converting the detected signal into a digital signal, the microprocessor 20 for performing a required operation for locking the wavelengths of the respective optical signals after performing the fast Fourier transform with respect to data sampled by the A/D converter 16, and the D/A converter 18 for converting digital data detected by the microprocessor 20 into a analog control signal to lock the wavelengths of the respective lasers.

At this time, the sampling frequency of the A/D converter 16 is 250 KHz, and its resolution is 12 bits.

Also, the A/D converter 16 has a sampling speed at least twice the frequencies of the pilot tones $\omega_1, \omega_2 \ldots \omega_n$ to sample the pilot tones $\omega_1, \omega_2 \ldots \omega_n$, and has at least two input ports to receive the output signals. The respective ports are synchronized to detect the phase of the signal.

The fast Fourier transform is performed with respect to the electric signal by the digital signal processing board 12

Figure 2:
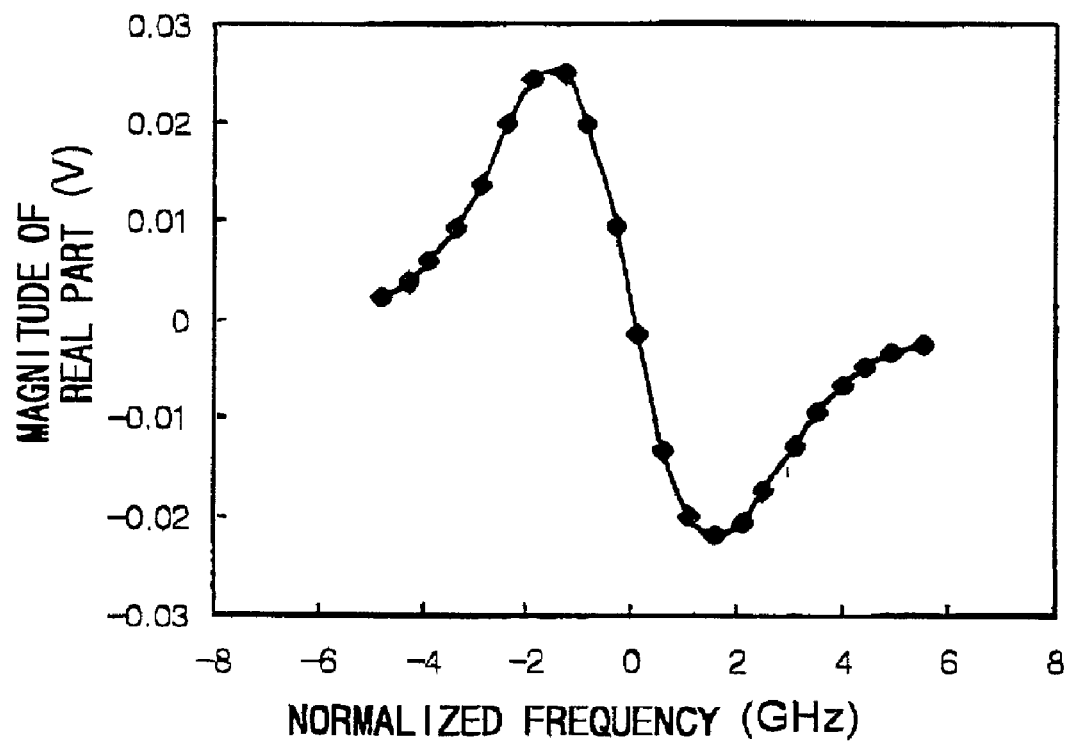
FIG. 2 is a view illustrating real part values obtained by performing the fast Fourier transform with respect to the signal having passed through an etalon filter and receivers of FIG. 1.

FIG. 2 shows the Fourier-transformed real part values of the third channel measured according to the laser frequencies. The horizontal axis represents the difference between the laser frequencies and the corresponding resonance peak values of the Fabry-Perot etalon filter 24.

If the frequencies of the lasers 22a, 22b . . . 22n are smaller than the resonance frequencies of the Fabry-Perot etalon filter 24, the data of the Fourier-transformed real part represents a positive number, while if the frequencies are larger than the resonance frequencies, the data represents a negative number. At this time, if the data of the real part becomes positive in a range (i.e., locking range) having a slope where the data or the real part is negative, the temperature of the lasers 22a, 22b . . . 22n are adjusted using the D/A converter 18 to increase the frequencies of the lasers.

Meanwhile, if the data of the real part is negative, the frequencies of the lasers 22a, 22b . . . 22n are reduced in the same manner as above.

As a result, by the above-described feedback control, the frequencies of the lasers 22a, 22b . . . 22n are locked into the resonance frequencies of the Fabry-Perot etalon filter 24.

The temperature of the respective lasers 22a, 22b . . . 22n is maintained through a control circuit, and thus the output frequencies of the lasers are controlled to be within ±100 MHz.

The D/A converter 18 in the digital signal processing board 12 has 16 output ports, and thus the frequencies of 16 channels can be simultaneously locked by an operation.

Figure 3:
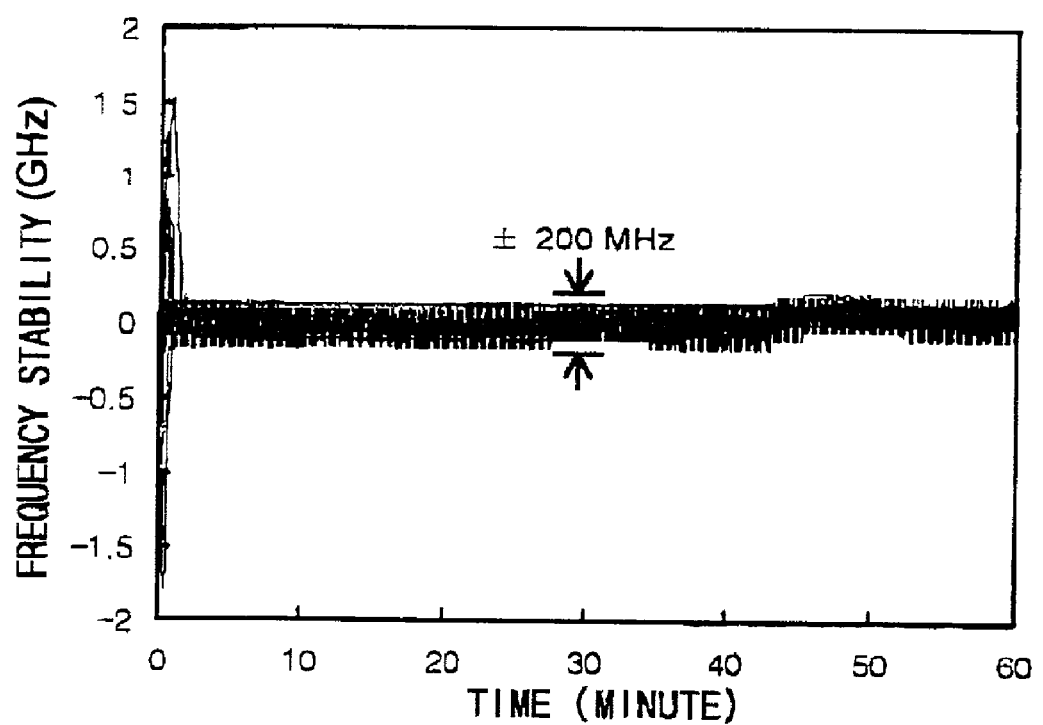
FIG. 3 is a view illustrating the optical frequency stability measured after the optical frequencies are locked according to the present invention.

FIG. 3 shows the optical frequency stability measured using a commercialized wavelength meter. The resolution of the multi-wavelength meter is 100 MHz.

It can be recognized that 16 lasers 22a, 22b . . . 22n can be locked within ±200 MHz in one minute after the control loop is operated.

The maximum frequency stability range is limited to ±4 GHz when the reflection ratio of the Fabry-Perot etalon filter 24 is 88% (i.e., bandwidth of 4 GHz), but this problem can be solved by searching the locking range as varying the temperature of the respective lasers 22a, 22b . . . 22n through the microprocessor 20 even though the locking range is small.

Meanwhile, if the Fabry-Perot etalon filter 24 having the reflection ratio of 30% (i.e., bandwidth of 40 GHz) is used, the locking range is increased to ±30 GHz, but the frequency stability becomes ±2 GHz to deteriorate the performance.

This is because the magnitude of the first derivative that can be measured by the digital signal processing board 12 becomes small and thus the performance deteriorates if the bandwidth of the Fabry-Perot etalon filter 24 is increased.

As the number of channels is increased, the frequency stability of she WDM lasers is degraded since the magnitude of the optical signal inputted to the optical receivers 14a and 14b. If the reflection ratio of the Fabry-Perot etalon filter 24 is 30%, and the number of channels is 32, the frequency stability is ±5 GHz, and the performance becomes more degraded.

In consequence, the locking apparatus 10 using the Fabry-Perot etalon filter 24 cannot support the WDM system having 64 channels or more.

However, in this case, the problem can be solved by using a plurality of receivers, heightening the resolution of the A/D converter 16, or using a Fabry-Perot etalon filter having a high reflection ratio.

The optical outputs of the respective lasers can be controlled to be within ±0.1 dB using an automatic output control circuit employing a monitoring optical receiver positioned in a laser package.

As described above, the multi-wavelength locking method and apparatus for the WDM optical communication system according to the present invention can simultaneously lock lots of WDM channels through one control loop, and can accurately and simultaneously lock the frequencies of the respective lasers by effectively suppressing the frequency offset due to the intensity modulation produced in the lasers using the fast Fourier transform.

Since the frequency locking apparatus according to the present invention can be easily implemented by a digital signal processing board, which is composed of two optical receivers, an A/D converter, a D/A converter, a microprocessor, etc., and a Fabry-Perot etalon filter, it can make a great contribution to the wavelength locking of the multi-channel WDM optical communication system.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A multi-wavelength locking apparatus for a wavelength division multiplexing (WDM) optical communication system, comprising:

modulation means for modulating output wavelengths of a plurality of transmission lasers having different wavelengths;

optical distribution means for dividing an optical signal into two parts to lock wavelengths of the wavelength-division-multiplexed optical signal simultaneously;

first optical detection means for detecting one of the two divided parts of the optical signal;

optical filtering means for filtering the wavelength-division-multiplexed optical signal in an optical frequency range;

second optical detection means for detecting the other of the two divided parts of the optical signal after passing through the optical filtering means to lock the wavelengths of the wavelength-division-multiplexed optical signal into respective reference frequencies;

operation means connected to the first and second optical detection means for detecting a first derivative of the optical filtering means by performing an operation with respect to the two divided parts of the detected optical signal, one of said parts being filtered by said optical filtering means and the other of said parts being unfiltered by said optical filtering means; and output means for producing a specified output for controlling the transmission lasers in accordance with the detected first derivative.

2. The apparatus as claimed in claim 1, wherein the optical distribution means comprises a 2×2 optical coupler for extracting the optical signal at a predetermined ratio.

3. The apparatus as claimed in claim 1, wherein the optical detection means comprises optical receivers.

4. The apparatus as claimed in claim 1, wherein the optical filtering means comprises a Fabry-Perot etalon filter whose spacing between resonance frequencies is similar to a channel spacing of the wavelength-division-multiplexed optical signal.

5. The apparatus as claimed in claim 1, wherein the optical filtering means comprises an optical fiber Fabry-Perot filter whose spacing between resonance frequencies is similar to a channel spacing of the wavelength-division-multiplexed optical signal.

6. The apparatus as claimed in claim 1, wherein the optical filtering meas comprises an arrayed waveguide grating whose spacing between resonance frequencies is similar to a channel spacing of the wavelength-division-multiplexed optical signal.

7. The apparatus as claimed in claim 1, wherein the optical filtering means comprises an optical filter that can perform a filtering in the vicinity of an optical frequency region where the wavelength-division-multiplexed optical signals should be operated.

8. The apparatus as claimed in claim 1, wherein the operation means comprises:
   an analog-to-digital (A/D) converter for sampling pilot tones to convert the signal detected by the optical detection means into digital data; and
   a microprocessor for performing a required operation with respect to the transformed data.

9. The apparatus as claimed in claim 8, wherein the A/D converter has a speed corresponding to at least twice frequencies of the pilot tones, and at least two input ports, and wherein the respective ports are synchronized.

10. The apparatus as claimed in claim 8, wherein the microprocessor measures a real part and an imaginary part by performing the fast Fourier transform with respect to the output data of the A/D converter, and then detects a first derivative of the optical filtering means from respective reference frequencies using the real part of the converted data.

11. The apparatus as claimed in claim 1, wherein the output means comprises a digital-to-analog (D/A) converter for converting digital data detected by the operation means into an analog control signal.

12. The apparatus as claimed in claim 11, wherein the D/A converter locks the multi-wavelengths by controlling temperature or current of the transmission lasers.

13. A multi-wavelength locking method for a wavelength division multiplexing (WDM) optical communication system, comprising the steps of:
   frequency-modulating an optical signal by applying a small and specified sine-wave current to a bias current for driving WDM lasers;
   detecting pilot tones produced after filtering the optical signal through filtering means, and converting the detected pilot tones into a digital signal by performing a sampling of the detected signal;
   detecting a magnitude and phase of the pilot tones by performing a fast Fourier transform;
   providing Fourier-transformed data as a first derivative signal for the filtering means; and
   locking an operation wavelength of WDM channels by controlling the temperature or current if resonance frequencies of the filtering means coincide with a respective standard frequency.

14. The method as claimed in claim 13, wherein the step of frequency-modulating the optical signal adds small modulation current having different frequencies to insertion current of the WDM lasers, and produces the pilot tones by simultaneously modulating wavelengths of the respective WDM lasers.

15. The method as claimed in claim 13 or 14, wherein modulation indexes of the WDM lasers modulated at the step for modulating the optical signal are within 10%.

16. The method as claimed in claim 13 or 14, wherein the pilot tones are simultaneously applied to frequency stabilization, channel recognition, and monitoring of the optical signal in the WDM optical communication system.

* * * * *